United States Patent
Kang

(10) Patent No.: US 9,224,981 B2
(45) Date of Patent: Dec. 29, 2015

(54) ORGANIC LIGHT EMITTING DISPLAY APPARATUS AND METHOD OF MANUFACTURING THE SAME

(71) Applicant: Samsung Display Co., Ltd., Yongin, Gyeonggi-do (KR)

(72) Inventor: Tae-Wook Kang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/958,448

(22) Filed: Aug. 2, 2013

(65) Prior Publication Data

US 2014/0159000 A1 Jun. 12, 2014

(30) Foreign Application Priority Data

Dec. 6, 2012 (KR) .................. 10-2012-0141158

(51) Int. Cl.
| | |
|---|---|
| *H01L 29/08* | (2006.01) |
| *H01L 35/24* | (2006.01) |
| *H01L 51/00* | (2006.01) |
| *H01L 51/52* | (2006.01) |
| *H01L 51/56* | (2006.01) |

(52) U.S. Cl.
CPC ........ *H01L 51/5253* (2013.01); *H01L 51/5256* (2013.01); *H01L 51/56* (2013.01)

(58) Field of Classification Search
CPC ...................................... H01L 51/00
USPC ....................................... 349/149
See application file for complete search history.

(56) References Cited

U.S. PATENT DOCUMENTS

| | | | |
|---|---|---|---|
| 7,507,616 B2 * | 3/2009 | Seo et al. ............... | 438/158 |
| 7,915,823 B2 * | 3/2011 | Hayashi .................. | 313/512 |
| 8,389,983 B2 * | 3/2013 | Seo et al. ................ | 257/40 |

(Continued)

FOREIGN PATENT DOCUMENTS

| | | | |
|---|---|---|---|
| KR | 20010098078 | * 11/2001 | ............... G02F 1/13 |
| KR | 2008-0114263 | 12/2008 | |

(Continued)

OTHER PUBLICATIONS

Korean Office Action dated Dec. 27, 2013 for Korean Patent Application No. KR 10-2012-0141158 which corresponds to captioned U.S. Appl. No. 13/958,448, and cites the above-identified Korean references.

(Continued)

*Primary Examiner* — Telly Green
(74) *Attorney, Agent, or Firm* — Knobbe Martens Olson & Bear LLP

(57) ABSTRACT

An organic light emitting display apparatus including a thin film encapsulation layer of an improved structure. The organic light emitting display apparatus includes: a display unit formed on a substrate; metal wires formed on an outer portion of the display unit on the substrate; and a thin film encapsulation layer formed by alternately stacking at least one organic layer and at least one inorganic layer on the display unit for sealing the display unit, wherein the at least one organic layer is separated from the metal wires so as not to contact the metal wires. According to the above structure, since the organic layer that is close to the display unit is separated completely from the metal wires formed on an outer portion of the display unit, moisture infiltration to the display unit via the metal wires may be prevented.

24 Claims, 6 Drawing Sheets

(56) References Cited

U.S. PATENT DOCUMENTS

| | | | |
|---|---|---|---|
| 2006/0100299 A1* | 5/2006 | Malik et al. ................... 522/31 |
| 2007/0153208 A1* | 7/2007 | Sakaguchi et al. ............ 349/149 |
| 2009/0002283 A1 | 1/2009 | Park et al. |
| 2009/0051274 A1* | 2/2009 | Hayashi ........................ 313/504 |
| 2009/0153042 A1 | 6/2009 | Izumi et al. |
| 2010/0200846 A1 | 8/2010 | Kwack et al. |
| 2010/0244073 A1* | 9/2010 | Ito et al. ......................... 257/98 |
| 2010/0320909 A1 | 12/2010 | Izumi |
| 2011/0140164 A1* | 6/2011 | Seo et al. ...................... 257/100 |
| 2012/0091477 A1 | 4/2012 | Kim |
| 2012/0139821 A1* | 6/2012 | Kim et al. ....................... 345/76 |
| 2012/0161613 A1 | 6/2012 | Kim |
| 2012/0235171 A1* | 9/2012 | Kim et al. ....................... 257/88 |
| 2012/0242221 A1* | 9/2012 | Kim et al. ..................... 313/512 |
| 2013/0228754 A1* | 9/2013 | Park ................................. 257/40 |
| 2013/0229107 A1* | 9/2013 | Park .............................. 313/504 |
| 2013/0230664 A1* | 9/2013 | Park .............................. 427/523 |
| 2013/0230665 A1* | 9/2013 | Park .............................. 427/535 |
| 2014/0138634 A1* | 5/2014 | Lee et al. ........................ 257/40 |

FOREIGN PATENT DOCUMENTS

| KR | 10-2009-0064320 A | 6/2009 |
| KR | 2010-0090888 | 8/2010 |
| KR | 10-2010-0138816 A | 12/2010 |
| KR | 10-2012-0040480 A | 4/2012 |
| KR | 2012-0075170 | 7/2012 |

OTHER PUBLICATIONS

Korean Notice of Allowance dated Nov. 15, 2014 for Korean Patent Application No. KR 10-2012-0141158 which corresponds to captioned U.S. Appl. No. 13/958,448, and cites the above-identified reference numbered 2.

* cited by examiner

`US 9,224,981 B2`

ORGANIC LIGHT EMITTING DISPLAY APPARATUS AND METHOD OF MANUFACTURING THE SAME

CROSS-REFERENCE TO RELATED APPLICATIONS

This application claims the benefit of Korean Patent Application No. 10-2012-0141158, filed on Dec. 6, 2012, in the Korean Intellectual Property Office, the disclosure of which is incorporated herein in its entirety by reference.

BACKGROUND

1. Field

The present embodiments relate to an organic light emitting display apparatus, and more particularly, to an organic light emitting display apparatus having a thin film encapsulation layer of an improved structure and a method of manufacturing the organic light emitting display apparatus.

2. Description of the Related Technology

In general, an organic light emitting display apparatus includes a display unit having a structure in which a light emission layer formed of an organic material is disposed between an anode electrode and a cathode electrode. When voltages that are different from each other are applied respectively to the anode electrode and the cathode electrode, holes injected from the anode electrode and electrons injected from the cathode electrode recombine in the light emission layer to generate excitons, and when the excitons enter a ground state from an excited state, light emission occurs and images are displayed.

In addition, if the light emission layer of the display unit is exposed directly to moisture, light emitting characteristics easily degrade, and thus, to address the above problem, an encapsulation layer covers the light emission layer. Recently, a thin film encapsulation layer in which organic layers and inorganic layers are alternately stacked has been mainly used.

Here, the inorganic layers prevent moisture from infiltrating into the display unit, and the organic layers mainly serve to grant the thin film encapsulation layer flexibility or planarize the thin film encapsulation layer, rather than the moisture infiltration prevention. The organic layers are not able to prevent the moisture infiltration actually. Therefore, if the organic layers are connected to a moisture source on an outside of the thin film encapsulation layer, the external moisture may infiltrate in the display unit via the organic layers, thereby deteriorating the light emission layer.

Meanwhile, various metal wires including wires for protective circuit that blocks static electricity are provided on an outer portion of the display unit in the organic light emitting display apparatus. However, when forming a thin film encapsulation layer, the organic layers in the thin film encapsulation layer generally cover some parts of the metal wires disposed on the outer portion of the display unit. Then, a moisture infiltration path through which the moisture may infiltrate from outside into the display unit is formed, thereby affecting life span of the organic light emitting display apparatus. The external moisture may be induced through side surfaces of the metal wires having poor step coverage, and then, the moisture may be induced to the organic layers of the thin film encapsulation layer that covers the metal wires. Thus, it seems like a path through which the moisture is induced to the display unit is formed in the organic layers.

Otherwise, an organic layer may cover the metal wires, the thin film encapsulation layer may cover the metal wires and the organic layer, and a first organic layer in the thin film encapsulation layer may directly contact the organic layer. In this case, the external moisture infiltrates through the organic layer covering the metal wires, and the moisture infiltrates to the display unit via the first organic layer in the thin film encapsulation layer, thereby damaging the organic light emitting display apparatus.

Otherwise, if the organic layers in the thin film encapsulation layer cover the metal wires, the organic layers in a liquid phase may extend to outside along side surfaces of the metal wires, before hardening the organic layers. In this case, if the inorganic layers of the thin film encapsulation layer cannot cover the extended portions of the organic layers, the external moisture may infiltrate to the display unit via the extended portions of the organic layers, thereby damaging the organic light emitting display apparatus.

As described above, if the moisture infiltration path is formed, degradation of the display unit is accelerated, and the lifespan of the organic light emitting display apparatus reduces greatly. Thus, effective countermeasures to address the above described problems are necessary.

SUMMARY

The present embodiments provide an organic light emitting display apparatus having an improved thin film encapsulation layer so as to effectively block moisture infiltration from outside of a display unit to the display unit, and a method of manufacturing the organic light emitting display apparatus.

According to an aspect of the present embodiments, there is provided an organic light emitting display apparatus including: a display unit formed on a substrate; metal wires formed on an outer portion of the display unit on the substrate; and a thin film encapsulation layer formed by alternately stacking at least one organic layer and at least one inorganic layer on the display unit for sealing the display unit, wherein the at least one organic layer is separated from the metal wires so as not to contact the metal wires.

An outermost layer of the thin film encapsulation layer may be an organic layer or an inorganic layer.

The at least one organic layer may include a first organic layer adjacent to the display unit, and a second organic layer formed on the first organic layer with the at least one inorganic layer interposed therebetween.

The organic layer may be three or more organic layers including an additional organic layer, in addition to the first organic layer and the second organic layer.

The first organic layer may be separated from the metal wires so as not to overlap the metal wires, and the second organic layer may be disposed so as to partially overlap the metal wires.

The first and second organic layers may be separated from the metal wires so as not to overlap with a region where the metal wires are formed.

A layer of the thin film encapsulation layer, which directly contacts the display unit, may be an inorganic layer or an organic layer.

At least one of an organic layer and an inorganic layer may be formed on the metal wires.

The organic layer in the thin film encapsulation layer may include one of polyimide, acryl, epoxy, silicon, and allyl, and the organic layer on the metal wires comprises one of acryl and polyimide.

The inorganic layer in the thin film encapsulation layer may include one of AlOx, SiNx, SiOx, SiOxNy, indium tin oxide (ITO), aluminium zinc oxide (AZO), ZnO, and ZrO, and the inorganic layer on the metal wires may include one of SiNx and SiOx.

According to another aspect of the present embodiments, there is provided a method of manufacturing an organic light emitting display apparatus, the method including: forming a display unit on a substrate; forming metal wires on an outer portion of the display unit on the substrate; and forming a thin film encapsulation layer by stacking at least one organic layer and at least one inorganic layer alternately on the display unit, so as to seal the display unit, wherein the at least one organic layer is separated from the metal wires so as not to contact the metal wires.

An outermost layer of the thin film encapsulation layer may be an organic layer or an inorganic layer.

The at least one organic layer may include a first organic layer adjacent to the display unit, and a second organic layer formed on the first organic layer with the at least one inorganic layer interposed therebetween.

The organic layer may be three or more organic layers including an additional organic layer, in addition to the first organic layer and the second organic layer.

The first organic layer may be separated from the metal wires so as not to overlap the metal wires, and the second organic layer may be disposed so as to partially overlap the metal wires.

The first and second organic layers may be separated from the metal wires so as not to overlap with a region where the metal wires are formed.

A layer of the thin film encapsulation layer, which directly contacts the display unit, may be an inorganic layer.

A layer of the thin film encapsulation layer, which directly contacts the display unit, may be an organic layer.

At least one of an organic layer and an inorganic layer may be formed on the metal wires.

The organic layer in the thin film encapsulation layer may include one of polyimide, acryl, epoxy, silicon, and allyl, and the organic layer on the metal wires may include one of acryl and polyimide.

The inorganic layer in the thin film encapsulation layer may include one of AlOx, SiNx, SiOx, SiOxNy, indium tin oxide (ITO), aluminium zinc oxide (AZO), ZnO, and ZrO, and the inorganic layer on the metal wires may include one of SiNx and SiOx.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1A:
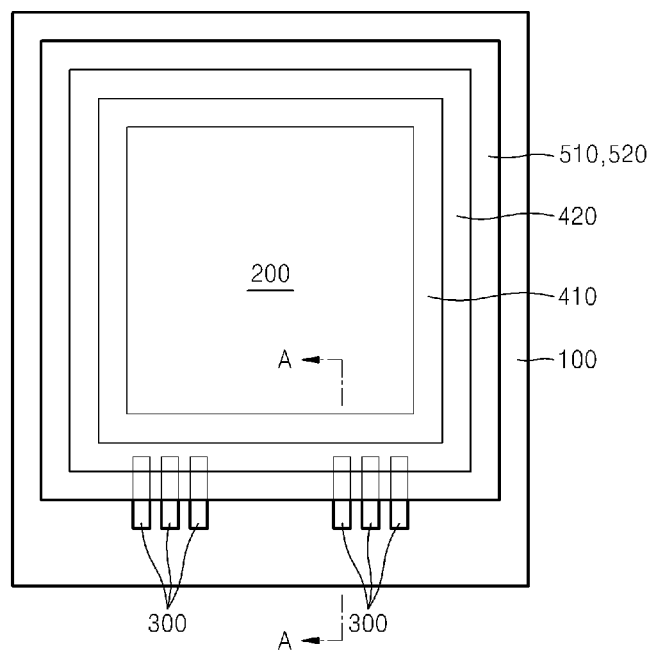
FIG. 1A is a plan view of an organic light emitting display apparatus according to an embodiment.

Hereinafter, embodiments will be described with reference to accompanying drawings.

Like numbers refer to like elements throughout. In the description of the present embodiments, if it is determined that a detailed description of commonly-used technologies or structures related to the embodiments may unnecessarily obscure the subject matter of the embodiments, the detailed description will be omitted.

In the drawings, the thicknesses of layers and regions are exaggerated for clarity. It will also be understood that when a layer is referred to as being "on" another layer or substrate, it can be directly on the other layer or substrate, or intervening layers may also be present.

Figure 1B:
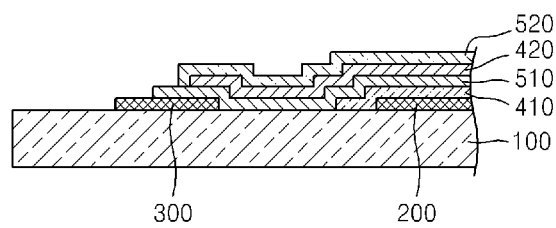
FIG. 1B is a cross-sectional view of the organic light emitting display apparatus taken along a line A-A of FIG. 1A.
Figure 5:
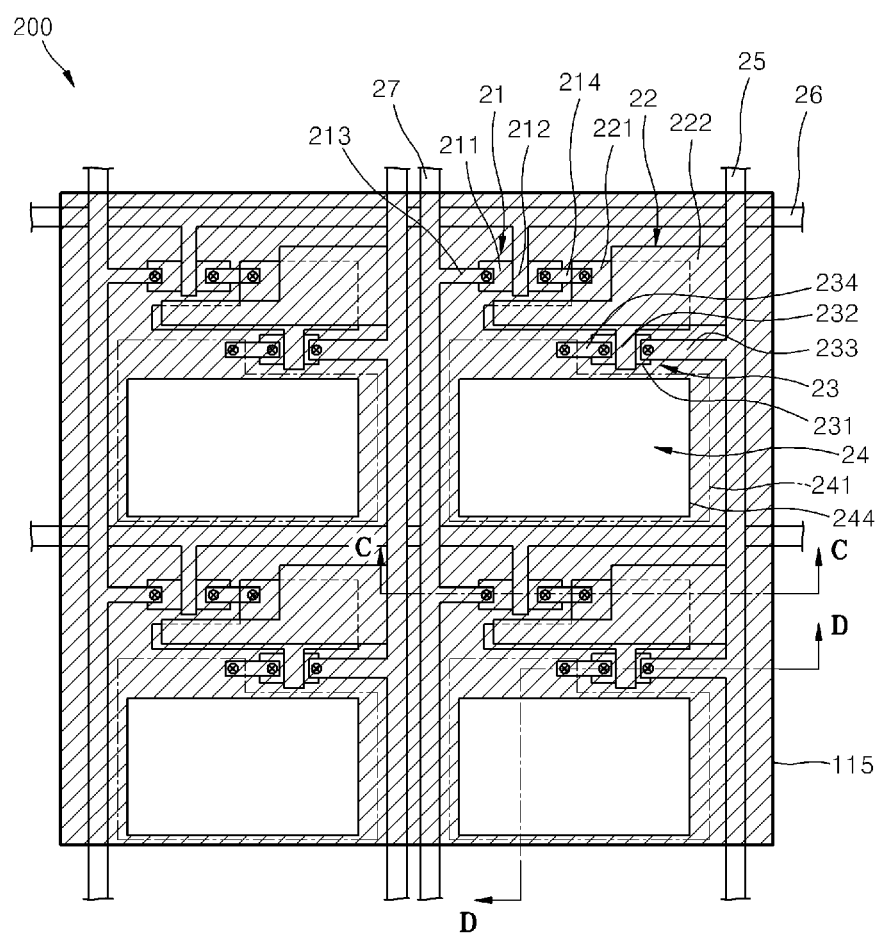
FIG. 5 is a partially enlarged plan view of some pixels included in a display unit.

FIG. 1A is a plan view of an organic light emitting display apparatus according to an embodiment, and FIG. 1B is a cross-sectional view of the organic light emitting display apparatus taken along a line A-A of FIG. 1A. FIG. 5 is a partially enlarged plan view showing some pixels of a display unit 200, and FIG. 6 is an equivalent circuit diagram of a pixel.

First, referring to FIGS. 1A and 1B, in the organic light emitting display apparatus of the present embodiments, a display unit 200 for displaying images is disposed on a substrate 100, and organic layers 410 and 420 and inorganic layers 510 and 520 are alternately stacked on the display unit 200 as a thin film encapsulation layer. Thus, the display unit 200 is sealed between the substrate 100 and the thin film encapsulation layers 410, 420, 510, and 520.

Metal wires 300 used as a protective circuit for blocking static electricity are disposed on an outer portion of the display unit 200 on the substrate 100. Since the metal wires 300 and the organic layers 410 and 420 in the thin film encapsulation layer block little moisture infiltration when being compared with the inorganic layers 510 and 520, if weak portions of the metal wires 300, through which moisture is infiltrated easily, are connected to the organic layers 410 and 420 of the thin film encapsulation layer, a path through which external moisture infiltrates to the display unit 200 is formed. Here, the weak portions denote portions of the metal wires 300 having poor profiles, A portion that an inorganic layer does not completely cover, a portion covered by an organic layer such as acryl or polyimide layer to which an organic layer of the thin film encapsulation layer directly contacts, or an extended portion of the organic layer in the thin film encapsulation layer along with a side surface of the metal wires (that may be covered by an organic or inorganic layer separately from the thin film encapsulation layer) so that the inorganic layer cannot completely cover. Therefore, according to the current embodiment, a structure of the organic light emitting display apparatus is improved so as not to form the moisture infiltration path. The characterized structure will be described below, and detailed structure of the display unit 200 will be described herein.

Figure 6:
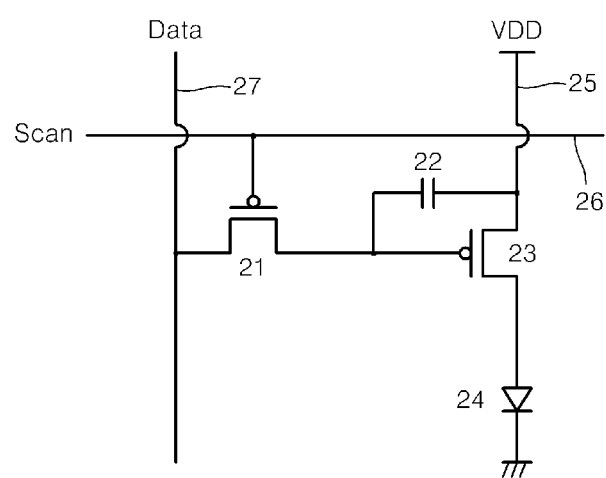
FIG. 6 is an equivalent circuit diagram of a pixel shown in FIG. 5.

In the display unit 200, a plurality of pixels shown in FIG. 5 are formed, and each of the pixels may be expressed an equivalent circuit diagram shown in FIG. 6.

As shown in FIGS. 5 and 6, each of the pixels includes a first thin film transistor (TFT) 21 for switching, at least two second TFTs 23 for driving, a capacitor 22, and an organic electroluminescence device (hereinafter, referred to as an "EL device") 24.

The first TFT 21 is driven by a scan signal applied to a gate line 26 to transfer a data signal applied to a data line 27.

The second TFT 23 determines an amount of electric current induced to the EL device 24 according to the data signal transferred from the first TFT 21, for example, a voltage difference Vgs between a gate and a source.

The capacitor 22 stores the data signal transferred from the first TFT 21 for one frame period.

Figure 7:
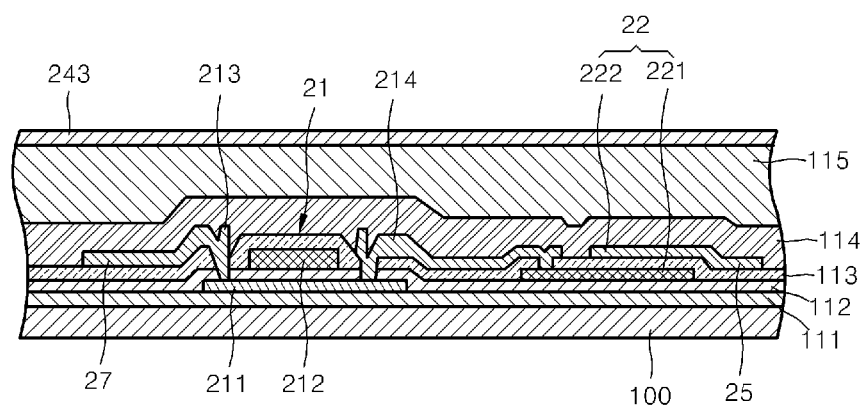
FIG. 7 is a cross-sectional view of the pixel taken along a line C-C of FIG. 5.
Figure 8:
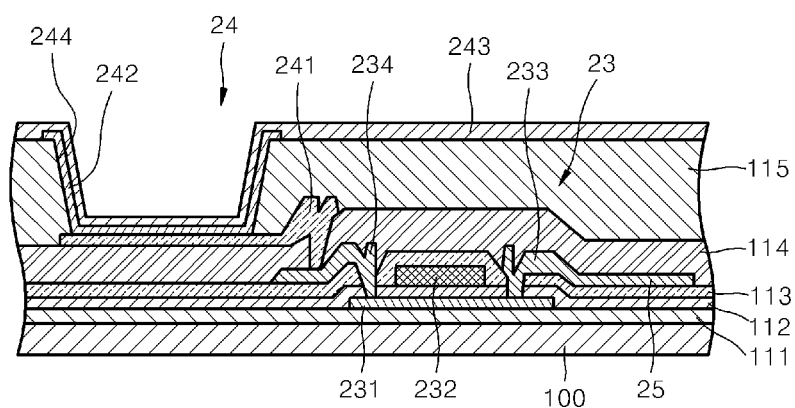
FIG. 8 is a cross-sectional view of the pixel taken along a line D-D of FIG. 5.

To realize the above described circuit, an organic light emitting display apparatus having a structure shown in FIG. 5, FIG. 7, or FIG. 8 is formed, and this will be described in more detail below.

As shown in FIGS. 5, 7, and 8, a buffer layer 111 is formed on a substrate 100, and the first TFT 21, the second TFT 23, the capacitor 22, and the EL device 24 are formed on the buffer layer 111.

As shown in FIGS. 5 and 7, the first TFT 21 includes a first active layer 211 formed on the buffer layer 111, a gate insulating layer 112 formed on the first active layer 211, and a gate electrode 212 formed on the gate insulating layer 112.

The first active layer 211 may be formed as an amorphous silicon thin film or a polycrystalline silicon thin film. Such a semiconductor active layer has a source region and a drain region that are doped with N-type or P-type impurities to a high concentration. Otherwise, the first active layer 211 may comprise oxide semiconductor. For example, the oxide semiconductor may include an oxide of a material selected from group 12, 13, and 14 metal elements such as zinc (Zn), indium (In), gallium (Ga), tin (Sn), cadmium (Cd), germanium (Ge), or hafnium (Hf), and combinations thereof. For example, the first active layer 211 may include G-I—Z—O[$(In_2O_3)a(Ga_2O_3)b(ZnO)c$] (a, b, c are real numbers respectively satisfying conditions of a≥0, b≥0, c>0).

The gate insulating layer 112 is disposed on the first active layer 211, and the gate electrode 212 is formed at a predetermined region on the gate insulating layer 112. The gate electrode 212 is connected to the gate line 26 applying TFT turning-on/off signals.

An inter-insulator 113 is formed on the gate electrode 212, and a source electrode 213 and a drain electrode 214 are formed to respectively contact the source region and the drain region of the first active layer 211 via contact holes. The source electrode 213 is connected to the data line 27 shown in FIG. 7 to supply the data signal to the first active layer 211, and the drain electrode 214 is connected to a first charging electrode 221 of the capacitor 22 to supply electric power to the capacitor 22.

A passivation layer 114 comprising $SiO_2$ or $SiNx$ is formed on the source and drain electrodes 213 and 214, and a planarization layer 115 comprising acryl, polyimide, or BCB is formed on the passivation layer 114.

The capacitor 22 is located between the first TFT 21 and the second TFT 23, and stores a driving voltage required to drive the second TFT 23 for one frame period. As shown in FIGS. 5 and 7, the capacitor 22 may include a first charging electrode 221 connected to the drain electrode 214 of the first TFT 21, a second charging electrode 222 formed on the first charging electrode 221 to overlap the first charging electrode 221 and electrically connected to a driving power line 25 that applies a driving power, and the inter-insulator 113 formed between the first charging electrode 221 and the second charging electrode 222 to be used as a dielectric substance.

As shown in FIGS. 5 and 8, the second TFT 23 includes a second active layer 231 formed on the buffer layer 111, and the second active layer 231 includes a source region and a drain region doped with N-type or P-type impurities to a high concentration. The second active layer 231 may be also comprise oxide semiconductor. For example, the oxide semiconductor may include an oxide of a material selected from group 12, 13, and 14 metal elements such as zinc (Zn), indium (In), gallium (Ga), tin (Sn), cadmium (Cd), germanium (Ge), or hafnium (Hf), and combinations thereof. For example, the second active layer 231 may include G-I—Z—O[$(In_2O_3)a(Ga_2O_3)b(ZnO)c$] (a, b, c are real numbers respectively satisfying conditions of a≥0, b≥0, c>0). A gate electrode 232 that is connected to the first charging electrode 221 of the capacitor 22 with the gate insulating layer 112 interposed therebetween to supply TFT turning-on/off signals is formed on the second active layer 231. A source electrode 233 that is connected to the driving power line 25 to supply a reference voltage to the second active layer 231 and a drain electrode 234 that connects the second TFT 23 to the EL device 24 to apply a driving electric power to the EL device 24 are formed on the gate electrode 232. The inter-insulator 113 is disposed between the gate electrode 232 and the source and drain electrodes 233 and 234, and the passivation layer 114 is disposed between the source and drain electrode 233 and 234 and a first electrode 241 that is an anode of the EL device 24.

An insulating planarization layer 115 comprising acryl is disposed on the first electrode 241, and predetermined openings 244 are formed in the planarization layer 115 to form the EL device 24 in each of the openings 244.

The EL device 24 emits red light, green light, and blue light according to a flow of the electric current to display predetermined image information. The EL device 24 includes the first electrode 241 that is an anode connected to the drain electrode 234 of the second TFT 23 to receive a positive electric power from the drain electrode 234, a second electrode 243 that is a cathode disposed to cover entire pixels to supply a negative electric power, and a light emission layer 242 disposed between the first and second electrodes 241 and 243 to emit light.

The light emission layer 242 may comprise a low-molecular weight organic material or a high-molecular weight organic material. If the low-molecular weight organic material is used, then the light emission layer 242 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

If a high-molecular weight organic material is used, the light emission layer 242 may have a structure including the HTL and EML. Here, the HTL may comprise poly(3,4-ethylenedioxythiophene) (PEDOT), and the EML may comprise a polymer organic material based on polyphenylene vinylene (PPV) and polyfluorene. In the light emission layer 242, one unit pixel may consist of sub-pixels respectively emitting red light, green light, and blue light. Otherwise, the light emission layer may be commonly formed throughout the sub-pixels without depositing electroluminescent material in each of the sub-pixels. Here, the light emission layer may be formed by stacking layers including light emitting materials emitting the red, green, and blue light in a vertical direction or mixing the layers. Also, if white light may be emitted, other colors may be combined. In addition, a color conversion layer or a color filter for converting the white light into a predetermined color light may be further formed.

However, the light emission layer 242 is very vulnerable to moisture, and thus, if the moisture infiltrates to the display unit 200, image displaying characteristic of the organic light emitting display apparatus deteriorates easily.

Referring back to FIGS. 1A and 1B, the structure of the organic light emitting display apparatus according to the embodiment will be described below.

The display unit 200 shown in FIG. 1 include the above-described pixels, and the images are displayed on the display unit 200. The TFTs, capacitors, and the EL devices shown in FIGS. 5, 7, and 8 are arranged in the display unit 200.

The thin film encapsulation layer 410, 420, 510, and 520 is formed on the display unit 200 to protect the display unit 200 against the external moisture and oxygen. The thin film encapsulation layer has a structure in which a first organic layer 410, a first inorganic layer 510, a second organic layer 420, and a second inorganic layer 520 are stacked in the stated order. The first organic layer 410 directly covers the display unit 200, the first inorganic layer 510 covers the first organic layer 410, and then, the second organic layer 420 and the second inorganic layer 520 cover the above layers. Therefore, when the thin film encapsulation layer is formed by stacking the organic and inorganic layers alternately, performances such as the moisture infiltration prevention and the flexibility may be obtained.

Here, the first organic layer 410 that is the closest to the display unit 200 is completely separated from the metal wires 300. Since the first organic layer 410 directly contacts the display unit 200, a moisture infiltration path to the display unit 200 may be formed when the first organic layer 410 is connected to an external moisture source. Therefore, in the present embodiment, the first organic layer 410 is completely separated from the metal wires 300 that may become a source of the moisture, thereby preventing the moisture from infiltrating to the display unit 200 from the outside.

Therefore, according to the structure in which the metal wires 300 that may become the moisture source are completely separated from the first organic layer 410 that is adjacent to the display unit 200, a possibility of moisture infiltration to the display unit 200 via the metal wires 300 and the first organic layer 410 may be removed basically.

The organic light emitting display apparatus having the above structure may be manufactured through following processes.

First, the display unit 200 and the metal wires 300 are formed on the substrate 100. The metal wires 300 may be formed through a patterning process that is independently performed from those of forming the display unit 200. Otherwise, when forming the source and drain electrodes 233 and 234 (refer to FIG. 8) of the display unit 200, the metal wires 300 may be formed together by using the same deposition material as that of the source and drain electrodes 233 and 234.

In addition, the thin film encapsulation layer is formed on the display unit 200, and as described above, the first organic layer 410 is separately formed from the metal wires 300 so as not to overlap the metal wires 300, and the first inorganic layer 510 is formed on the first organic layer 410. In addition, the second organic layer 420 is formed. Here, since the second organic layer 420 is disposed on the display unit 200 with the inorganic layer 510 interposed therebetween, a part of the organic layer 420 may overlap the metal wires 300 as shown in FIGS. 1A and 1B. In addition, the second inorganic layer 520 is formed as the outermost layer of the thin film encapsulation layer.

Here, the first and second organic layers 410 and 420 may comprise one of polyimide, acryl, epoxy, silicon, and allyl, and the first and second inorganic layers 510 and 520 may comprise one of AlOx, SiNx, SiOx, SiOxNy, ITO, AZO, ZnO, and ZrO.

The first and second organic layers 410 and 420 in the thin film encapsulation layer may be formed by using a monomer, and the monomer may include at least one of acryl-based monomer, epoxy-based monomer, silicon-based monomer, and allyl-based monomer. A monomer layer is formed by various methods, for example, a flash evaporation, a thermal evaporation, an atomizing, a spraying, a screen printing, an inkjet printing, and a slot die coating method, and the monomer layer may be hardened by light such as ultraviolet (UV) ray or visible ray. Here, the organic layers 410 and 420 are not limited to the monomer layer. In addition, the first organic layer 410 of the thin film encapsulation layer has to be separated from the metal wires 300, as described above.

In the organic light emitting display apparatus manufactured in the above described way, the first organic layer 410 contacting the display unit 200 and the metal wires 300 on the outer portion of the display unit 200 are completely separated from each other, and thus, a possibility of moisture infiltration to the display unit 200 via the metal wires 300 and the first organic layer 420 is blocked basically. When adopting the above structure, reduction of the lifespan due to the moisture infiltration may be addressed effectively.

Hereinafter, modifications of the above basic structure will be described below.

Figure 2:
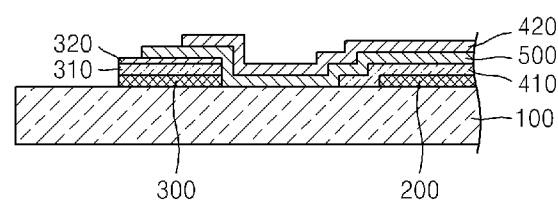
FIG. 2 is a cross-sectional view of an organic light emitting display apparatus according to another embodiment.

In the previous embodiment, the thin film encapsulation layer including the organic and inorganic layers is formed only on the display unit 200. In the modified example shown in FIG. 2, an organic layer 310 and an inorganic layer 320 may be formed on the metal wires 300. Here, a single layered structure of an organic or inorganic layer may be formed, as well as a dual-layered structure including the organic and inorganic layers 310 and 320 of FIG. 2. In addition, the organic layer 310 and the inorganic layer 320 formed on the metal wires 300 may be formed before forming the thin film encapsulation layer. For example, the organic and inorganic layers 310 and 320 may be formed together when devices such as the TFT of the display unit 200 are formed. As such, when the organic and inorganic layers 310 and 320 are formed on the metal wires 300, a possibility of moisture infiltration to the display unit 200 via a layer contacting the metal wires 300 may be further reduced. The organic layer 310 may comprise one of polyimide and acryl, and the inorganic layer 320 may comprise SiNx, SiOx, or a combination thereof.

In the structure of the present embodiment, if the first organic layer 410 of the thin film encapsulation layer is formed on the metal wires 300 that are covered by the organic and inorganic layers 310 and 320, the first organic layer 410 may dispersed to outside along the side surfaces of the metal wires 300 in a liquid phase, and accordingly, the external moisture may infiltrate to the display unit 200 via the first organic layer 410. Therefore, the first organic layer 410 of the thin film encapsulation layer has to be separated from the metal wires 300.

Here, the first and second organic layers 410 and 420 of the thin film encapsulation layer may comprise, for example, a monomer, and the monomer may include at least one of acryl-based monomer, epoxy-based monomer, silicon-based monomer, and allyl-based monomer. A monomer layer is formed by various methods, for example, a flash evaporation, a thermal evaporation, an atomizing, a spraying, a screen printing, an inkjet printing, and a slot die coating method, and the monomer layer may be hardened by light such as ultraviolet (UV) ray or visible ray. Here, the organic layers 410 and 420 are not limited to the monomer layer. In addition, the first organic layer 410 of the thin film encapsulation layer has to be separated from the metal wires 300, as described above.

The organic and inorganic layers 310 and 320 on the metal wires 300 may be formed through general film forming processes such as a coating, an exposure, and a development process.

In addition, in the above embodiment, the outermost layer of the thin film encapsulation layer is the inorganic layer 520; however, the organic layer 420 may be the outermost layer of the thin film encapsulation layer.

According to the organic light emitting display apparatus of the present embodiment, the first organic layer 410 contacting the display unit 200 is completely separated from the metal wires 300 that may be the moisture source, and the metal wires 300 are covered by the organic and inorganic layers 310 and 320. Thus, the possibility of moisture infiltration to the display unit 200 via the metal wires 300 and the first organic layer 410 may be blocked basically. Then, reduction of the lifespan of the product due to the moisture infiltration may be prevented effectively.

Figure 3A:
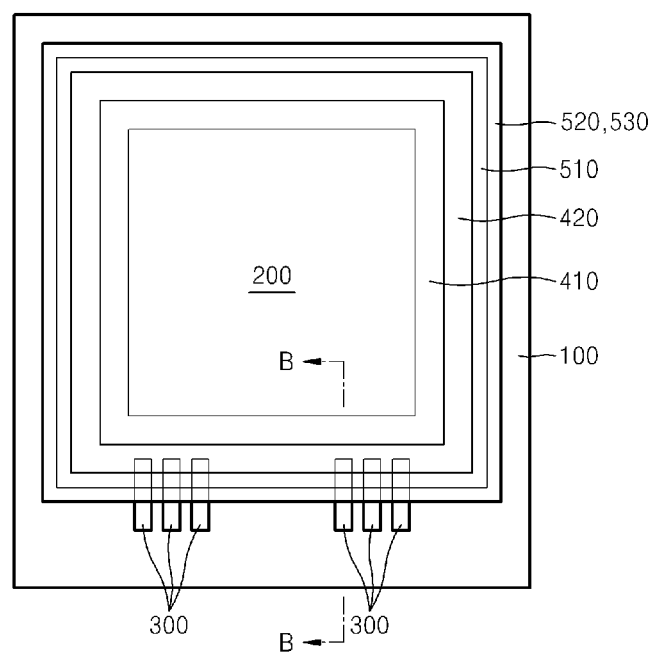
FIG. 3A is a plan view of an organic light emitting display apparatus according to another embodiment.
Figure 3B:
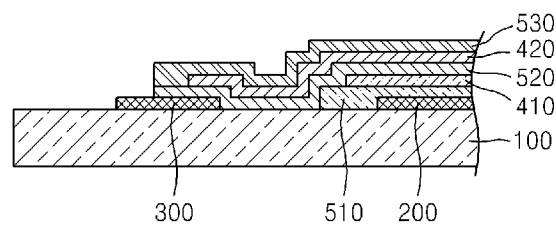
FIG. 3B is a cross-sectional view of the organic light emitting display apparatus taken along a line B-B of FIG. 3A.

Another modified example will be described below with reference to FIGS. 3A and 3B.

In the embodiment shown in FIGS. 1A and 1B, the first organic layer 410 of the thin film encapsulation layer directly contacts the display unit 200, while the first inorganic layer 510 directly contacts the display unit 200 and the first organic layer 410, the second inorganic layer 520, the second organic layer 420, and a third inorganic layer 530 are stacked on the first inorganic layer 510 in the stated order according to the present embodiment. Then, even if the metal wires 300 and the first organic layer 410 are connected to each other and a moisture infiltration path is formed, the moisture infiltration may be prevented since the first inorganic layer 510 surrounds the display unit 200.

Herein, the first and second organic layers 410 and 420 may comprise one or more of polyimide, acryl, epoxy, silicon, and allyl, and the first, second, and third inorganic layers 510, 520, and 530 may comprise one or more of AlOx, SiNx, SiOx, SiOxNy, ITO, AZO, ZnO, and ZrO.

According to the organic light emitting display apparatus of the present embodiment, the first organic layer 410 that is close to the display unit 200 is completely separated from the metal wires 300 that may be the source of moisture, and moreover, the first inorganic layer 510 covers right over the display unit 200. Thus, the possibility of moisture infiltration to the display unit 200 via the metal wires 300 and the first organic layer 410 may be blocked basically. Then, reduction of the lifespan of the product due to the moisture infiltration may be prevented effectively.

Figure 4:
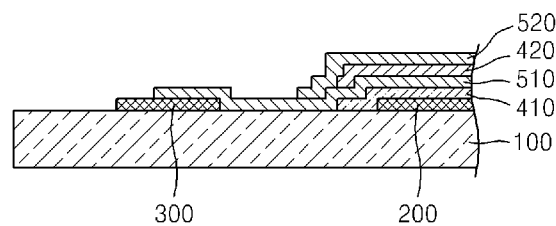
FIG. 4 is a cross-sectional view of an organic light emitting display apparatus according to another embodiment.

Another modified example will be described below with reference to FIG. 4.

The first and second organic layers 410 and 420 have different areas from each other according to the embodiment shown in FIGS. 1A and 1B, whereas the first and second organic layers 410 and 420 have the same areas as each other according to the present embodiment. The second organic layer 420 is separated from the metal wires 300 so as not to overlap the metal wires 300, like the first organic layer 410. Then, a possibility of generating a moisture infiltration hole by connecting the metal wires 300 to the second organic layer 420 and the first organic layer 410 through a hole of the first inorganic layer 510 may be blocked.

Therefore, according to the organic light emitting display apparatus of the present embodiments, since the organic layer that is the closest to the display unit is separated completely from the metal wires formed on an outer portion of the display unit, the possibility of moisture infiltration to the display unit via the metal wires and the organic layer may be prevented basically. Consequently, through the above configuration, reduction of the lifespan of the product due to the moisture infiltration may be prevented effectively.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic light emitting display apparatus comprising:
   a display unit formed on a substrate;
   metal wires formed on an outer portion of the display unit on the substrate; and
   a thin film encapsulation layer comprising alternately stacked two or more organic layers and at least one inorganic layer on the display unit for sealing the display unit, wherein one of the at least one inorganic layer extends from the display unit towards the metal wires a first length, wherein the two or more organic layers extend from the display unit towards the metal wires a second length, wherein the first length is greater than the second length, and
   wherein any one organic layer does not contact the metal wires so as not to form a moisture infiltration path from the metal wires to the display unit.

2. The organic light emitting display apparatus of claim 1, wherein an outermost layer of the thin film encapsulation layer is an organic layer.

3. The organic light emitting display apparatus of claim 1, wherein an outermost layer of the thin film encapsulation layer is an inorganic layer.

4. The organic light emitting display apparatus of claim 1, wherein the two or more organic layers comprise:
   a first organic layer adjacent to the display unit; and
   a second organic layer on the first organic layer with the at least one inorganic layer interposed therebetween.

5. The organic light emitting display apparatus of claim 4, wherein the two or more organic layers further comprises at least one additional organic layer, in addition to the first and second organic layers.

6. The organic light emitting display apparatus of claim 4, wherein the first organic layer is separated from the metal wires so as not to overlap the metal wires, and wherein the second organic layer is disposed so as to partially overlap the metal wires.

7. The organic light emitting display apparatus of claim 4, wherein the first and second organic layers are separated from the metal wires so as not to overlap with a region where the metal wires are formed.

8. The organic light emitting display apparatus of claim 1, wherein a layer of the thin film encapsulation layer, which directly contacts the display unit, is an inorganic layer.

9. The organic light emitting display apparatus of claim 1, wherein a layer of the thin film encapsulation layer, which directly contacts the display unit, is an organic layer.

10. The organic light emitting display apparatus of claim 1, wherein at least one of an organic layer and an inorganic layer is formed on the metal wires.

11. The organic light emitting display apparatus of claim 10, wherein the two or more organic layers in the thin film encapsulation layer comprise one of polyimide, acryl, epoxy, silicon, and allyl, and wherein the organic layer on the metal wires comprises one of acryl and polyimide.

12. The organic light emitting display apparatus of claim 10, wherein the inorganic layer in the thin film encapsulation layer comprises one of AlOx, SiNx, SiOx, SiOxNy, indium tin oxide (ITO), aluminium zinc oxide (AZO), ZnO, and ZrO, and wherein the inorganic layer on the metal wires comprises one of SiNx and SiOx.

13. A method of manufacturing an organic light emitting display apparatus, the method comprising:
forming a display unit on a substrate;
forming metal wires on an outer portion of the display unit on the substrate; and
forming a thin film encapsulation layer by stacking two or more organic layers and at least one inorganic layer alternately on the display unit, so as to seal the display unit, wherein one of the at least one inorganic layer extends from the display unit towards the metal wires a first length, wherein the two or more organic layers extend from the display unit towards the metal wires a second length, wherein the first length is greater than the second length, and
wherein any one organic layer does not contact the metal wires so as not to form a moisture infiltration path from the metal wires to the display unit.

14. The method of claim 13, wherein an outermost layer of the thin film encapsulation layer is an organic layer.

15. The method of claim 13, wherein an outermost layer of the thin film encapsulation layer is an inorganic layer.

16. The method of claim 13, wherein the two or more organic layers comprise:
a first organic layer adjacent to the display unit; and
a second organic layer formed on the first organic layer with the at least one inorganic layer interposed therebetween.

17. The method of claim 16, wherein the two or more organic layers further comprise at least one additional organic layer, in addition to the first organic layer and the second organic layer.

18. The method of claim 16, wherein the first organic layer is separated from the metal wires so as not to overlap the metal wires, and wherein the second organic layer is disposed so as to partially overlap the metal wires.

19. The method of claim 16, wherein the first and second organic layers are separated from the metal wires so as not to overlap with a region where the metal wires are formed.

20. The method of claim 13, wherein a layer of the thin film encapsulation layer, which directly contacts the display unit, is an inorganic layer.

21. The method of claim 13, wherein a layer of the thin film encapsulation layer, which directly contacts the display unit, is an organic layer.

22. The method of claim 13, wherein at least one of an organic layer and an inorganic layer is formed on the metal wires.

23. The method of claim 22, wherein the two or more organic layers in the thin film encapsulation layer comprises one of polyimide, acryl, epoxy, silicon, and allyl, and wherein the organic layer on the metal wires comprises one of acryl and polyimide.

24. The method of claim 22, wherein the inorganic layer in the thin film encapsulation layer comprises one of AlOx, SiNx, SiOx, SiOxNy, indium tin oxide (ITO), aluminium zinc oxide (AZO), ZnO, and ZrO, and wherein the inorganic layer on the metal wires comprises one of SiNx and SiOx.

* * * * *